US012003250B2

(12) United States Patent
Ko et al.

(10) Patent No.: US 12,003,250 B2
(45) Date of Patent: Jun. 4, 2024

(54) DIGITAL-TO-ANALOG CONVERTER INCLUDING CURRENT CELL ARRAY

(71) Applicant: SAMSUNG ELECTRONICS CO., LTD., Suwon-si (KR)

(72) Inventors: Kyeongjoon Ko, Yongin-si (KR); Jaehyun Park, Seoul (KR); Junhan Bae, Hwaseong-si (KR); Gyeongseok Song, Hwaseong-si (KR); Jongjae Ryu, Changwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 17/837,752

(22) Filed: Jun. 10, 2022

(65) Prior Publication Data

US 2022/0399900 A1 Dec. 15, 2022

(30) Foreign Application Priority Data

Jun. 10, 2021 (KR) .................. 10-2021-0075742
Sep. 15, 2021 (KR) .................. 10-2021-0123417

(51) Int. Cl.
*H03M 1/12* (2006.01)
*H03M 1/68* (2006.01)
*H03M 1/74* (2006.01)
*H03M 1/06* (2006.01)
*H03M 1/66* (2006.01)

(52) U.S. Cl.
CPC .......... *H03M 1/682* (2013.01); *H03M 1/687* (2013.01); *H03M 1/747* (2013.01); *H03M 1/0617* (2013.01); *H03M 1/66* (2013.01)

(58) Field of Classification Search
CPC ...... H03M 1/682; H03M 1/687; H03M 1/747; H03M 1/0617; H03M 1/66
See application file for complete search history.

(56) References Cited

U.S. PATENT DOCUMENTS

| | | | |
|---|---|---|---|
| 6,954,164 B2 | 10/2005 | Lee et al. | |
| 7,439,894 B2 | 10/2008 | Peng et al. | |
| 8,928,512 B2 | 1/2015 | Yuan et al. | |
| 9,094,042 B2 | 7/2015 | Onódy et al. | |
| 10,756,750 B2 | 8/2020 | Han et al. | |
| 2005/0128116 A1* | 6/2005 | Dalt ................... | H03M 1/0648 341/144 |
| 2021/0028159 A1 | 1/2021 | Huang et al. | |

FOREIGN PATENT DOCUMENTS

CN 102571098 A 7/2012
KR 10-1674909 B1 11/2016

* cited by examiner

*Primary Examiner* — Joseph J Lauture
(74) *Attorney, Agent, or Firm* — Sughrue Mion, PLLC

(57) ABSTRACT

A digital-to-analog converter includes a current cell array including a plurality of current cells, each current cell of the plurality of current cells being configured to generate a current of a same magnitude; a first pattern connecting first current cells, among the plurality of current cells, arranged along a diagonal line of the current cell array; a second pattern connecting second current cells, among the plurality of current cells, arranged along a first oblique line parallel to the diagonal line; and a third pattern connecting third current cells, among the plurality of current cells, arranged along a second oblique line parallel to the diagonal line, the third pattern being electrically connected to the second pattern, wherein the diagonal line is between the first oblique line and the second oblique line.

20 Claims, 13 Drawing Sheets

| M8 | M9 | M10 | M11 | M12 | M13 | M14 | M15 | L | M1 | M2 | M3 | M4 | M5 | M6 | M7 |
|---|---|---|---|---|---|---|---|---|---|---|---|---|---|---|---|
| M7 | M8 | M9 | M10 | M11 | M12 | M13 | M14 | M15 | L | M1 | M2 | M3 | M4 | M5 | M6 |
| M6 | M7 | M8 | M9 | M10 | M11 | M12 | M13 | M14 | M15 | L | M1 | M2 | M3 | M4 | M5 |
| M5 | M6 | M7 | M8 | M9 | M10 | M11 | M12 | M13 | M14 | M15 | L | M1 | M2 | M3 | M4 |
| M4 | M5 | M6 | M7 | M8 | M9 | M10 | M11 | M12 | M13 | M14 | M15 | L | M1 | M2 | M3 |
| M3 | M4 | M5 | M6 | M7 | M8 | M9 | M10 | M11 | M12 | M13 | M14 | M15 | L | M1 | M2 |
| M2 | M3 | M4 | M5 | M6 | M7 | M8 | M9 | M10 | M11 | M12 | M13 | M14 | M15 | L | M1 |
| M1 | M2 | M3 | M4 | M5 | M6 | M7 | M8 | M9 | M10 | M11 | M12 | M13 | M14 | M15 | L |
| L | M1 | M2 | M3 | M4 | M5 | M6 | M7 | M8 | M9 | M10 | M11 | M12 | M13 | M14 | M15 |
| M15 | L | M1 | M2 | M3 | M4 | M5 | M6 | M7 | M8 | M9 | M10 | M11 | M12 | M13 | M14 |
| M14 | M15 | L | M1 | M2 | M3 | M4 | M5 | M6 | M7 | M8 | M9 | M10 | M11 | M12 | M13 |
| M13 | M14 | M15 | L | M1 | M2 | M3 | M4 | M5 | M6 | M7 | M8 | M9 | M10 | M11 | M12 |
| M12 | M13 | M14 | M15 | L | M1 | M2 | M3 | M4 | M5 | M6 | M7 | M8 | M9 | M10 | M11 |
| M11 | M12 | M13 | M14 | M15 | L | M1 | M2 | M3 | M4 | M5 | M6 | M7 | M8 | M9 | M10 |
| M10 | M11 | M12 | M13 | M14 | M15 | L | M1 | M2 | M3 | M4 | M5 | M6 | M7 | M8 | M9 |
| M9 | M10 | M11 | M12 | M13 | M14 | M15 | L | M1 | M2 | M3 | M4 | M5 | M6 | M7 | M8 |

| M8 | M9 | M10 | M11 | M12 | M13 | M14 | M15 | L | M1 | M2 | M3 | M4 | M5 | M6 | M7 |
|---|---|---|---|---|---|---|---|---|---|---|---|---|---|---|---|
| M7 | M8 | M9 | M10 | M11 | M12 | M13 | M14 | M15 | L | M1 | M2 | M3 | M4 | M5 | M6 |
| M6 | M7 | M8 | M9 | M10 | M11 | M12 | M13 | M14 | M15 | L | M1 | M2 | M3 | M4 | M5 |
| M5 | M6 | M7 | M8 | M9 | M10 | M11 | M12 | M13 | M14 | M15 | L | M1 | M2 | M3 | M4 |
| M4 | M5 | M6 | M7 | M8 | M9 | M10 | M11 | M12 | M13 | M14 | M15 | L | M1 | M2 | M3 |
| M3 | M4 | M5 | M6 | M7 | M8 | M9 | M10 | M11 | M12 | M13 | M14 | M15 | L | M1 | M2 |
| M2 | M3 | M4 | M5 | M6 | M7 | M8 | M9 | M10 | M11 | M12 | M13 | M14 | M15 | L | M1 |
| M1 | M2 | M3 | M4 | M5 | M6 | M7 | M8 | M9 | M10 | M11 | M12 | M13 | M14 | M15 | L |
| L | M1 | M2 | M3 | M4 | M5 | M6 | M7 | M8 | M9 | M10 | M11 | M12 | M13 | M14 | M15 |
| M15 | L | M1 | M2 | M3 | M4 | M5 | M6 | M7 | M8 | M9 | M10 | M11 | M12 | M13 | M14 |
| M14 | M15 | L | M1 | M2 | M3 | M4 | M5 | M6 | M7 | M8 | M9 | M10 | M11 | M12 | M13 |
| M13 | M14 | M15 | L | M1 | M2 | M3 | M4 | M5 | M6 | M7 | M8 | M9 | M10 | M11 | M12 |
| M12 | M13 | M14 | M15 | L | M1 | M2 | M3 | M4 | M5 | M6 | M7 | M8 | M9 | M10 | M11 |
| M11 | M12 | M13 | M14 | M15 | L | M1 | M2 | M3 | M4 | M5 | M6 | M7 | M8 | M9 | M10 |
| M10 | M11 | M12 | M13 | M14 | M15 | L | M1 | M2 | M3 | M4 | M5 | M6 | M7 | M8 | M9 |
| M9 | M10 | M11 | M12 | M13 | M14 | M15 | L | M1 | M2 | M3 | M4 | M5 | M6 | M7 | M8 |

DIGITAL-TO-ANALOG CONVERTER INCLUDING CURRENT CELL ARRAY

CROSS-REFERENCE TO RELATED APPLICATIONS

This application is based on and claims priority under 35 U.S.C. § 119 to Korean Patent Application No. 10-2021-0075742, filed on Jun. 10, 2021, and Korean Patent Application No. 10-2021-0123417, filed on Sep. 15, 2021, in the Korean Intellectual Property Office, the disclosures of which are incorporated by reference herein in their entireties.

BACKGROUND

The present disclosure relates to a digital-to-analog converter (DAC) may include a current cell array.

The DAC may convert a digital input into an analog output. As one of various structures of the DAC, a current steering DAC may generate a current having a magnitude corresponding to a value of the digital input, and generate the analog output from the generated current. The current steering DAC may include a plurality of current sources for generating current according to the digital input, and mismatch between the plurality of current sources may deteriorate the linearity of the current steering DAC.

SUMMARY

Example embodiments provide a digital-to-analog converter (DAC) providing high linearity and an operating method of the DAC.

According to an aspect of an example embodiment, a digital-to-analog converter includes: a current cell array including a plurality of current cells, each current cell of the plurality of current cells being configured to generate a current of a same magnitude; a first pattern connecting first current cells, among the plurality of current cells, arranged along a diagonal line of the current cell array; a second pattern connecting second current cells, among the plurality of current cells, arranged along a first oblique line parallel to the diagonal line; and a third pattern connecting third current cells, among the plurality of current cells, arranged along a second oblique line parallel to the diagonal line, the third pattern being electrically connected to the second pattern, wherein the diagonal line is between the first oblique line and the second oblique line.

According to an aspect of an example embodiment, a digital-to-analog converter includes: a decoder configured to generate a thermometer code from an upper bit group including a most significant bit (MSB) of a digital input of the digital-to-analog converter; a current cell array including a plurality of current cells, each current cell of the plurality of current cells being configured to generate a current of a same magnitude; and a switch circuit configured to select at least a part of currents generated by the current cell array, wherein the plurality of current cells includes: first current cells arranged along a diagonal line of the current cell array and corresponding to a first bit of the thermometer code; second current cells arranged along a first oblique line parallel to the diagonal line and corresponding to a second bit of the thermometer code; and third current cells arranged along a second oblique line parallel to the diagonal line and corresponding to the second bit of the thermometer code, and wherein the diagonal line is between the first oblique line and the second oblique line.

According to an aspect of an example embodiment, a method of converting a digital input into an analog output includes: generating a thermometer code from an upper bit group including a most significant bit (MSB) of the digital input; generating a reference current by a current cell array including a plurality of current cells, wherein each current cell of the plurality of current cells is configured to generate a current of a same magnitude; selecting at least a part of the reference current, based on the thermometer code and a lower bit group including a least significant bit of the digital input; and generating the analog output by summing a selected current, wherein the selecting the at least the part of the reference current includes selecting currents generated by first current cells, among the plurality of current cells, arranged with no two first current cells in a same row and with no two first current cells in a same column, based on one bit of the thermometer code.

BRIEF DESCRIPTION OF THE DRAWINGS

Example embodiments will be more clearly understood from the following detailed description taken in conjunction with the accompanying drawings in which.

DETAILED DESCRIPTION

Figure 1:
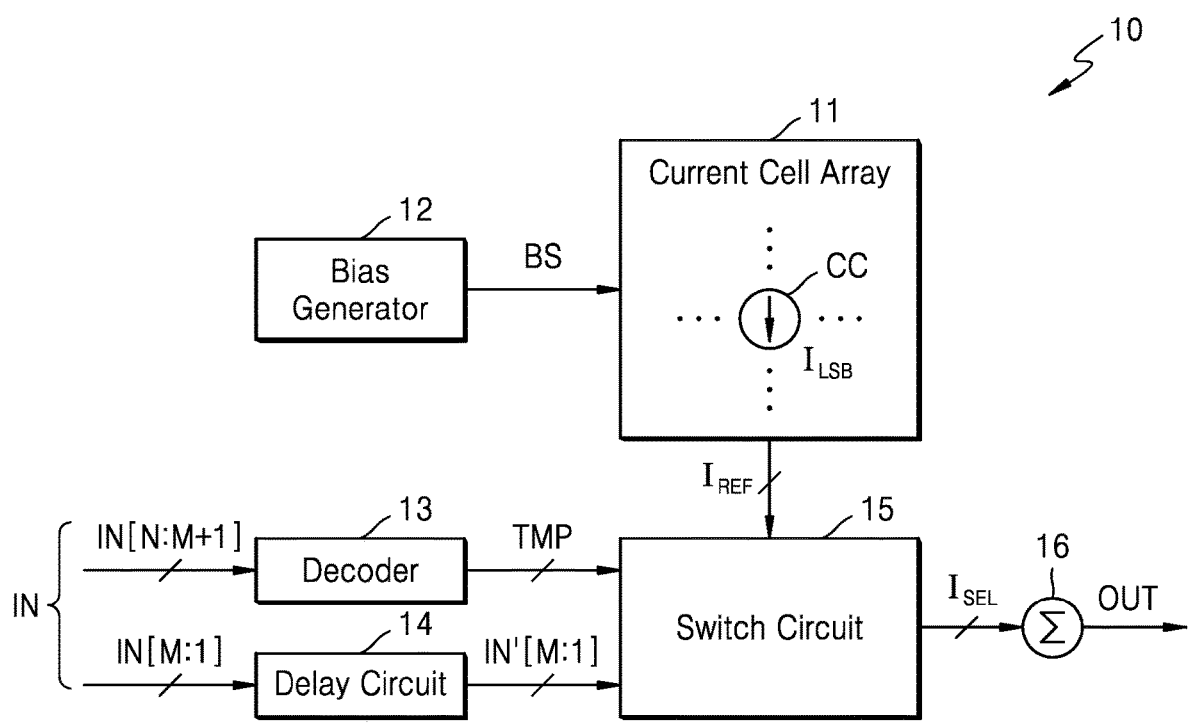
FIG. 1 is a block diagram showing a digital-to-analog converter (DAC) according to an example embodiment.

FIG. 1 is a block diagram showing a digital-to-analog converter (DAC) 10 according to an example embodiment. As shown in FIG. 1, the DAC 10 may include a current cell array 11, a bias generator 12, a decoder 13, a delay circuit 14, a switch circuit 15, and a summation circuit 16. In some embodiments, the DAC 10 may further include a latch circuit that latches an input IN and the latch circuit may provide an upper bit group IN[N:M+1] and a lower bit group IN[M:1] of the latched input IN to the decoder 13 and the delay circuit 14, respectively.

The DAC 10 may receive a digital input and generate an analog output having a magnitude corresponding to a value of the digital input. For example, as shown in FIG. 1, the DAC 10 may generate an output OUT from the input IN of N bits in which N is an integer greater than 1. In some embodiments, the DAC 10 may be manufactured by a semiconductor process. In some embodiments, components of the DAC 10 may be included in one die or package. In some embodiments, components of the DAC 10 may be included in each of two or more packages, and the DAC 10 may include a printed circuit board (PCB) on which the two or more packages are mounted.

The current cell array 11 may include a plurality of current cells each designed to generate a current of the same magnitude. For example, as shown in FIG. 1, the current cell array 11 may include a current cell CC, and the current cell CC may be designed to generate a LSB current $I_{LSB}$ based on a bias signal BS provided from the bias generator 12. The current cell array 11 may generate a reference current $I_{REF}$ that includes LSB currents generated by a plurality of current cells, respectively, and the reference current $I_{REF}$ may be provided to the switch circuit 15 through a plurality of conducting wires. In some embodiments, differently from that shown in FIG. 1, the current cell array 11 may drain the reference current $I_{REF}$ from the switch circuit 15. As will be described later, at least a part of the reference current $I_{REF}$ may be selected by the switch circuit 15, and a selected current $I_{SEL}$ may have a magnitude corresponding to the value of the input IN.

The bias generator 12 may provide the bias signal BS to the current cell array 11. For example, the bias generator 12 may generate at least one bias voltage, and the plurality of current cells included in the current cell array 11 may commonly receive at least one bias voltage provided from the bias generator 12. In some embodiments, the bias generator 12 may adjust the bias signal BS based on external control, and thus, the magnitude of the LSB current $I_{LSB}$ generated by each of the plurality of current cells may be adjusted, and as a result, the magnitude of the reference current $I_{REF}$ may be adjusted.

The decoder 13 may receive an upper bit group including a most significant bit (MSB) of the input IN and decode the upper bit group into a thermometer code TMP. The thermometer code TMP may refer to a code that includes 1 (or 0) of a number proportional to a value, and may be referred to as a unary code. For example, as shown in FIG. 1, the decoder 13 may receive the upper bit group IN[N:M+1] of (N−M) bits including the MSB (i.e., IN[N]) of the input IN of the N bits (M is an integer greater than 1 and less than N), and generate the thermometer code TMP of $(2^{N-M}-1)$ bits. Herein, it is assumed that the thermometer code TMP includes 1 of a number proportional to the value of the upper bit group of the input IN.

The delay circuit 14 may receive and delay a lower bit group including a least significant bit (LSB) of the input IN, and output a delayed lower bit group. For example, as shown in FIG. 1, the delay circuit 14 may receive a lower bit group IN[M:1] of M bits including the LSB (i.e., IN[1]) of the input IN of N bits, and output a delayed lower bit group IN'[M:1]. The delay circuit 14 may delay the lower bit group IN[M:1] of the input IN by as much as a time taken to generate the thermometer code TMP from the upper bit group IN[N:M+1] of the input IN in the decoder 13, such that the thermometer code TMP and the delayed lower bit group IN'[M:1] generated from the input IN of the same value may be simultaneously provided to the switch circuit 15. In some embodiments, the delay circuit 14 may include at least one logic gate, and the delay circuit 14 may delay the lower bit group IN[M:1] of the input (IN) based on a gate delay of at least one logic gate.

The switch circuit 15 may receive the thermometer code TMP from the decoder 13 and receive the delayed lower bit group IN'[M:1] from the delay circuit 14. Further, the switch circuit 15 may receive the reference current $I_{REF}$ from the current cell array 11, and output the selected current $I_{SEL}$ by selecting at least a part of the reference current $I_{REF}$ based on the thermometer code TMP and the delayed lower bit group IN'[M:1]. For example, as will be described later with reference to FIG. 2, each bit of the thermometer code TMP and of the delayed lower bit group IN'[M:1] may correspond to one group of at least one current cell included in the current cell array 11, and the switch circuit 15 may select currents generated by current cells of a group corresponding to non-zero bits in the thermometer code TMP and in the delayed lower bit group IN' out of the reference current $I_{REF}$. Herein, selection of a current generated by current cells included in the current cell array 11 by the switch circuit 15 may be simply referred to as selection of corresponding current cells by the switch circuit 15.

The switch circuit 15 may include a plurality of switches controlled by the thermometer code TMP and the delayed lower bit group IN'[M:1], and each of the plurality of switches may selectively include a current generated by a corresponding group of a current cell, out of the reference current $I_{REF}$, into the selected current $I_{SEL}$. For example, the switch circuit 15 may include switches connected to conducting wires provided with the reference current $I_{REF}$ from the current cell array 11, and the selected current $I_{SEL}$ may be provided to the summation circuit 16 through the conducting wires respectively connected to the switches.

The summation circuit 16 may receive the selected current $I_{SEL}$ from the switch circuit 15 and generate the output OUT by summing currents included in the selected current $I_{SEL}$. For example, the selected current $I_{SEL}$ may be provided from the switch circuit 15 through a plurality of conducting wires as described above, and the summation circuit 16 may generate the output OUT from a summation of currents received through the plurality of conducting wires, such that the output OUT may have a magnitude corresponding to the value of the input IN. In some embodiments, as will be described later with reference to FIG. 2, the summation circuit 16 may convert a summed current to a voltage and generate the output OUT having a voltage of a magnitude corresponding to the value of the input IN.

In some embodiments, the current cell array 11 may include a number of current cells corresponding to a range of the input IN, thus including $2^{N-1}$ current cells. In some embodiments, the current cell array 11 may include $2^N$ current cells, as described below with reference to FIG. 3A, etc., and one of the $2^N$ current cells may not be used or may be summed by the summation circuit 16 regardless of the input IN. As the number of bits of the input IN, i.e., N increases, the number of current cells included in the current cell array 11 may increase and the area of the current cell array 11 may increase. When the area of the current cell array 11 increases, influences upon each of a plurality of current cells included in the current cell array 11, e.g., a process, a voltage, a temperature, etc., may differ. Accordingly, each of the plurality of current cells may generate currents of different magnitudes and as a result, the linearity of the DAC 10 such as a differential nonlinearity (DNL) or integral nonlinearity (INL) may be deteriorated.

As will be described later, even when there are variations in the current cell array 11, the influence of the variations may be evenly exerted on the current cells selected by the switch circuit 15 according to the value of the input IN. Accordingly, the degradation of the linearity of the DAC 10 may be minimized, and the linearity of the DAC 10 may be improved without an additional cost, e.g., an area or power, and accordingly, the performance and efficiency of an application including the DAC 10 may be enhanced at the same time.

Figure 2:
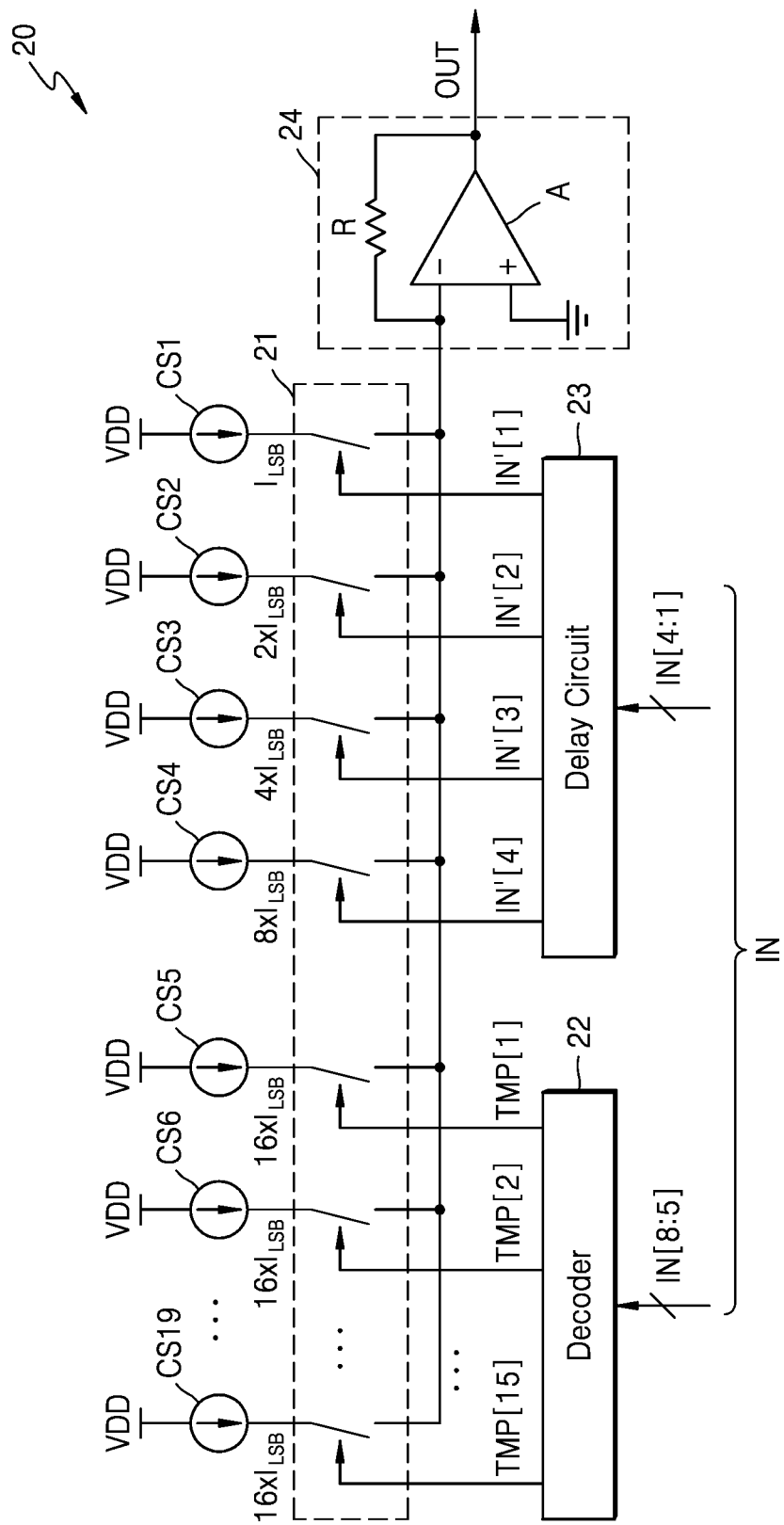
FIG. 2 is a block diagram showing a DAC according to an example embodiment.

FIG. 2 is a block diagram showing a DAC 20 according to an example embodiment. Specifically, the block diagram of FIG. 2 schematically shows an operation of a current steering DAC that generates an output OUT from an input IN of 8 bits (N=8). In the example of FIG. 2, a lower bit group (IN[4:1]) of the input IN may include 4 bits (M=4), and an upper bit group of the input IN IN[8:4] may include 4 bits (N−M=4). As shown in FIG. 2, the DAC 20 may include first through nineteenth current sources CS1 to CS19, a switch circuit 21, a decoder 22, a delay circuit 23, and a summation circuit 24.

Each of the first through nineteenth current sources CS1 to CS19 may include at least one current cell included in the current cell array 11 of FIG. 1. For example, the first current source CS1 that generates an LSB current $I_{LSB}$ may include one current cell, the second current source CS2 that generates twice the LSB current $I_{LSB}$ may include two current cells, the third current source CS3 that generates four times the LSB current $I_{LSB}$ may include four current cells, and the fourth current source CS4 that generates 8 times the LSB current $I_{LSB}$ may include eight current cells. In addition, each of the fifth to nineteenth current cells CS5 to CS19 may include 16 current cells and generate 16 times the LSB current $I_{LSB}$. Herein, the current cells included in the first to fourth current sources C1 to CS4 corresponding to the lower bit group of the input IN may be referred to as LSB current cells or LSB cells, and the current cells included in the fifth to nineteenth current sources CS5 to CS19 corresponding to the upper bit group of the input IN may be referred to as MSB current cells or MSB cells.

The switch circuit 21 may include 19 switches corresponding to the first to nineteenth current sources CS1 to CS19, and the 19 switches may respectively receive currents generated by the first to nineteenth current sources CS1 to CS19. The switches of the switch circuit 21 may be controlled by bits output from the decoder 22 and the delay circuit 23. For example, as shown in FIG. 2, the first to fourth current sources CS1 to CS4 may be respectively controlled by four bits IN'[1], IN'[2], IN'[3], and IN'[4] of a delayed lower bit group IN'[4:1]. Further, the fifth to nineteenth current sources CS5 to CS19 may be respectively controlled by 15 bits TMP[1] to TMP[15] of the thermometer code TMP. Each of the switches of the switch circuit 21 may have a certain structure, and may include at least one transistor in some embodiments.

The summation circuit 24 may receive a current having passed through the switch circuit 21 (i.e., $I_{SEL}$ of FIG. 1) and may generate an output OUT. For example, as shown in FIG. 2, the summation circuit 24 may include an amplifier A and a resistor R, and convert a current resulting from summation of the currents having passed through the switches of the switch circuit 21 into a voltage.

The linearity of the DAC 20 may depend on the accuracy of currents respectively generated by the first to nineteenth current sources CS1 to CS19 shown in FIG. 2. For example, when influence caused by variations in the current cells is exerted differently on the first to nineteenth current sources CS1 to CS19, each of which includes at least one current cell, then the currents respectively generated by the first to nineteenth current sources CS1 to CS19 may differently change and the linearity of the DAC 20 may be deteriorated. On the other hand, when influence caused by variations in the current cells is exerted commonly on (distributed among) the first to nineteenth current sources CS1 to CS19, each of which includes at least one current cell, then the currents respectively generated by the first to nineteenth current sources CS1 to CS19 may change commonly (track each other) and the linearity of the DAC 20 may be maintained or improved. Accordingly, grouping of at least one current cell included in each of the first to nineteenth current sources CS1 to CS19 in the current cell array 11 of FIG. 1 may be important. Hereinafter, various grouping of current cells that provide a high linearity of the DAC 20 will be described with reference to the drawings. Hereinafter, like the digital-to-analog converter 20 of FIG. 2, a DAC that receives an input IN of 8 bits including an upper bit group of 4 bits and a lower bit group of 4 bits may be mainly described. However, it is to be noted that exemplary embodiments are not limited thereby.

Figure 3A:
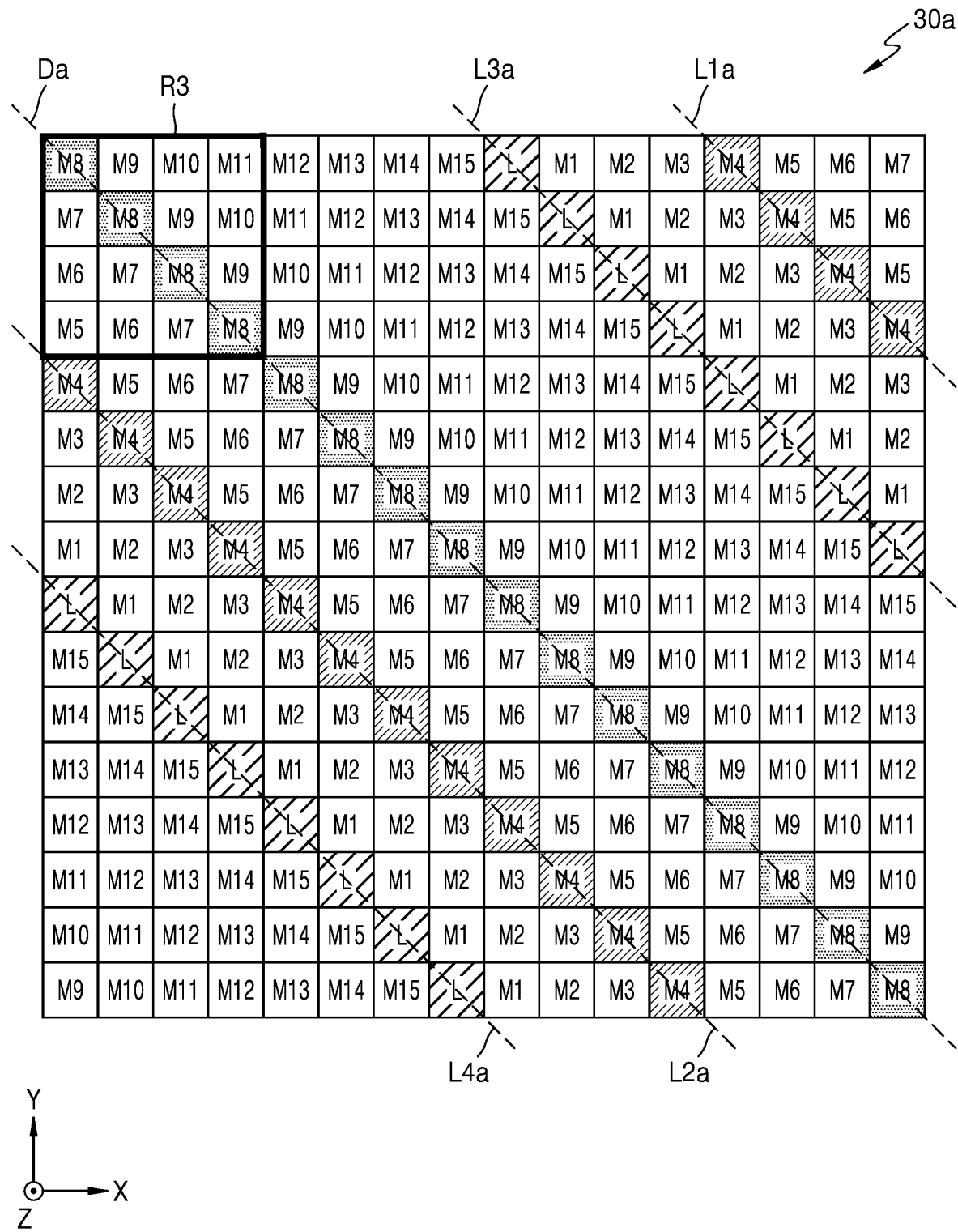
FIGS. 3A and 3B are views showing examples of a current cell array according to example embodiments.
Figure 3B:
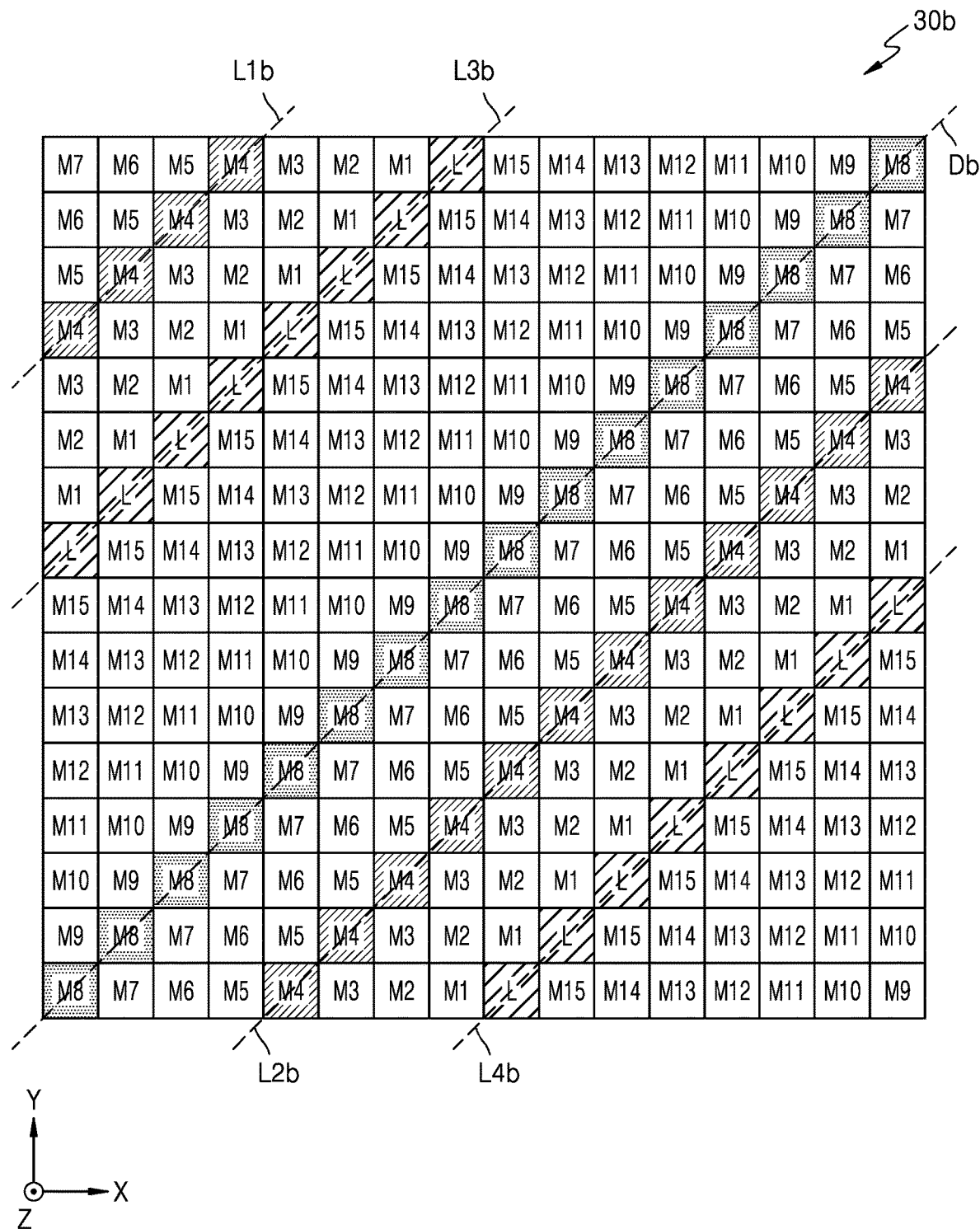

FIGS. 3A and 3B are views showing examples of a current cell array according to example embodiments. More specifically, FIGS. 3A and 3B show current cell arrays 30a and 30b included in a DAC that receives an 8-bit input and include 256 current cells, on a plane formed by an X axis and a Y axis. Hereinbelow, FIGS. 3A and 3B will be described with reference to FIG. 2, and redundant matters in the description of FIGS. 3A and 3B will be omitted.

Referring to FIGS. 3A and 3B, each of the current cell arrays 30a and 30b may include 256 current cells along 16 rows extending parallel to the X axis and 16 columns extending parallel to the Y axis. MSB current cells having the same reference numeral in FIGS. 3A and 3B may be included in the same current source, i.e., one of the fifth to nineteenth current sources CS5 to CS19. For example, 16 current cells indicated by 'M1' may be included in the fifth current source CS5 corresponding to an LSB TMP[1] of the thermometer code TMP, and 16 current cells indicated by 'M15' may be included in the nineteenth current source CS19 corresponding to an MSB TMP[15] of the thermometer code TMP. The MSB current cells having the same reference numeral may be interconnected through a pattern, and a current generated by the MSB current cells may be output to the outside of the current cell array 30a through the pattern. The pattern for connecting the current cells will be described later with reference to FIG. 5, which shows an enlargement of a region R3 of FIG. 3A. Further, 15 current cells among 16 current cells indicated by 'L' in FIGS. 3A and 3B may be included in one of the first to fourth current sources CS1 to CS4, and the remaining one current cell may not be used or may generate a current included in the selected current $I_{SEL}$ of FIG. 1, regardless of the value of the input IN.

The MSB current cells included in one current source may be arranged along a diagonal line Da of the current cell array 30a. For example, as shown in FIG. 3A, the 16 MSB current cells included in a twelfth current source CS12 corresponding to one bit TMP[8] of the TMP may be disposed along the diagonal line Da of the current cell array 30a. The MSB current cells included in one current source may be arranged along two oblique lines parallel to the diagonal line Da of the current cell array 30a. For example, as indicated by 'M4' in FIG. 3A, 16 MSB current cells included in the eighth current source CS8 corresponding to one bit TMP[4] of the thermometer code TMP may be arranged along a first oblique line L1a and a second oblique line L2a of the current cell array 30a, in which the first oblique line L1a and the second oblique line L2a may be parallel to the diagonal line Da. As shown in FIG. 3A, for 16 MSB current cells corresponding to one current source, the diagonal line Da is between the first oblique line L1a and the second oblique line L2a. As a result, the MSB current source cells included in one current source may be arranged mutually exclusively to rows of the current cell array 30a and may be arranged mutually exclusively to columns of the current cell array 30a.

When the MSB current cells are grouped as shown in FIG. 3A, influence caused by a variation may be exerted commonly on groups of the MSB current cells. For example, when a variation occurs on a side of the current cell array 30a, current cells respectively included in the fifth to nineteenth current sources CS5 to CS19 may commonly receive influence caused by the variation. Accordingly, the currents generated by the fifth to nineteenth current sources CS5 to CS19 may be equally increased or decreased, and thus the linearity of DAC may be maintained. As will be described later with reference to FIG. 5, etc., to group current cells, patterns for connecting the current cells may be added on the current cell array 30a, such that the linearity of the DAC may be enhanced without an additional cost, e.g., an area or power, and as a result, the performance and efficiency of an application including the DAC may be improved at the same time.

LSB current cells may be arranged along two oblique lines parallel to the diagonal line Da of the current cell array 30a. For example, as indicated by 'L' in FIG. 3A, 16 LSB current cells may be arranged along a third oblique line L3a and a fourth oblique line L4a of the current cell array 30a, in which the third oblique line L3a and the fourth oblique line L4a may be parallel to the diagonal line Da. These oblique lines may be referred to as "off-diagonals." As shown in FIG. 3A, for 16 LSB current cells, the diagonal line Da is between the third oblique line L3a and the fourth oblique line L4a. In some embodiments, the number of LSB current cells arranged along the third oblique line L3a may be equal to the number of LSB current cells arranged along the fourth oblique line L4a, and a distance between the third oblique line L3a and the diagonal line Da may be the same as a distance between the fourth oblique line L4a and the diagonal line Da. Thus, the third oblique line L3a and the fourth oblique line L4a may correspond to diagonal lines of quadrants of the current cell array 30a. L3a may be referred to as a main diagonal of an upper right sub-matrix of the current cell array. The corresponding quadrant for L3a is the upper right sub-matrix. Similarly, L4A may be referred to as a main diagonal of a lower left sub-matrix of the current cell array. The corresponding quadrant for 14a is the lower right sub-matrix.

Referring to FIG. 3B, MSB current cells included in one current source may be arranged along a diagonal line Db of the current cell array 30a. The diagonal line Da of FIG. 3A may have a negative slope in a Cartesian coordinate system including an X axis and a Y axis, and the diagonal line Db of FIG. 3B may have a positive slope. As indicated by 'M8' in FIG. 3B, 16 MSB current cells included in the twelfth current source CS12 corresponding to one bit TMP[8] of the thermometer code TMP may be arranged along the diagonal line Db of the current cell array 30b. In some embodiments, M8 corresponds to every current cell of a main diagonal and to no other current cells (see FIGS. 3A and 3B). The MSB current cells included in one current source may be arranged along two oblique lines parallel to the diagonal line Db of the current cell array 30b. For example, as indicated by 'M4' in FIG. 3B, 16 MSB current cells included in the eighth current source CS8 corresponding to one bit TMP[4] of the thermometer code TMP may be arranged along a first oblique line L1b and a second oblique line L2b of the current cell array 30b, in which the first oblique line L1b and the second oblique line L2b may be parallel to the diagonal line Db. As shown in FIG. 3B, for 16 MSB current cells corresponding to one current source, the diagonal line Db is between the first oblique line L1b and the second oblique line L2b.

The LSB current cells may be arranged along two oblique lines parallel to the diagonal line Db of the current cell array 30b. For example, as indicated by 'L' in FIG. 3B, 16 LSB current cells may be arranged along a third oblique line L3b and a fourth oblique line L4b of the current cell array 30b, in which the third oblique line L3b and the fourth oblique line L4b may be parallel to the diagonal line Db. As shown in FIG. 3B, for 16 LSB current cells, the diagonal line Db is between the third oblique line L3b and the fourth oblique line L4b. In some embodiments, the number of LSB current cells arranged along the third oblique line L3b may be equal to the number of LSB current cells arranged along the fourth oblique line L4b, and a distance between the third oblique line L3b and the diagonal line Db may be the same as a distance between the fourth oblique line L4b and the diagonal line Db.

Figure 4A:
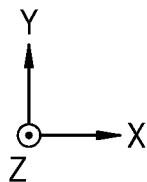
FIGS. 4A and 4B are views showing examples of current cells selected based on an input according to example embodiments.
Figure 4B:
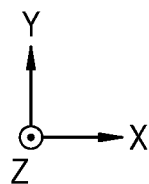

FIGS. 4A and 4B are views showing examples of current cells selected based on an input according to example embodiments. More specifically, FIG. 4A illustrates current cells selected when a value of the input IN is $2^{N-1}-1$ in a current cell array 40 including current cells grouped in the same manner as in FIG. 3A, and FIG. 4B illustrates current cells selected when a value of the input IN is $2^{N-1}$ in the current cell array 40 including the current cells grouped in the same manner as in FIG. 3A. Current cells hatched in FIGS. 4A and 4B may indicate selected current cells. Hereinafter, FIGS. 4A and 4B will be described with reference to FIG. 2.

In some embodiments, MSB current cells corresponding to a center code of a DAC may be arranged along a diagonal line of the current cell array 40. For example, as shown in FIGS. 4A and 4B, 16 MSB current cells indicated by 'M8' may be selected by the switch circuit 21 in response to the input IN that is equal to or greater than the center code (i.e., $2^{N-1}$) of the input IN of N bits, and current generated by the 16 MSB current cells may be used for the generation of the output OUT.

Referring to FIG. 4A, when the value of the input IN is $2^{N-1}-1$, LSB current cells may be selected, and the MSB current cells included in the fifth to eleventh current sources CS5 to CS11 may be selected. In addition, referring to FIG. 4B, the value of the input IN is equal to the center code, i.e., $2^{N-1}$, the LSB current cells may not be selected, and the MSB current cells included in the twelfth current source CS12 as well as the fifth to eleventh current sources CS5 to CS11 may be selected. As shown in FIGS. 4A and 4B, as the value of the input IN changes, the selected MSB current cells may be disposed at all of four edges of the current cell array 40, and as a result, influence caused by a variation that occurs locally may be commonly exerted on current sources.

Figure 5:
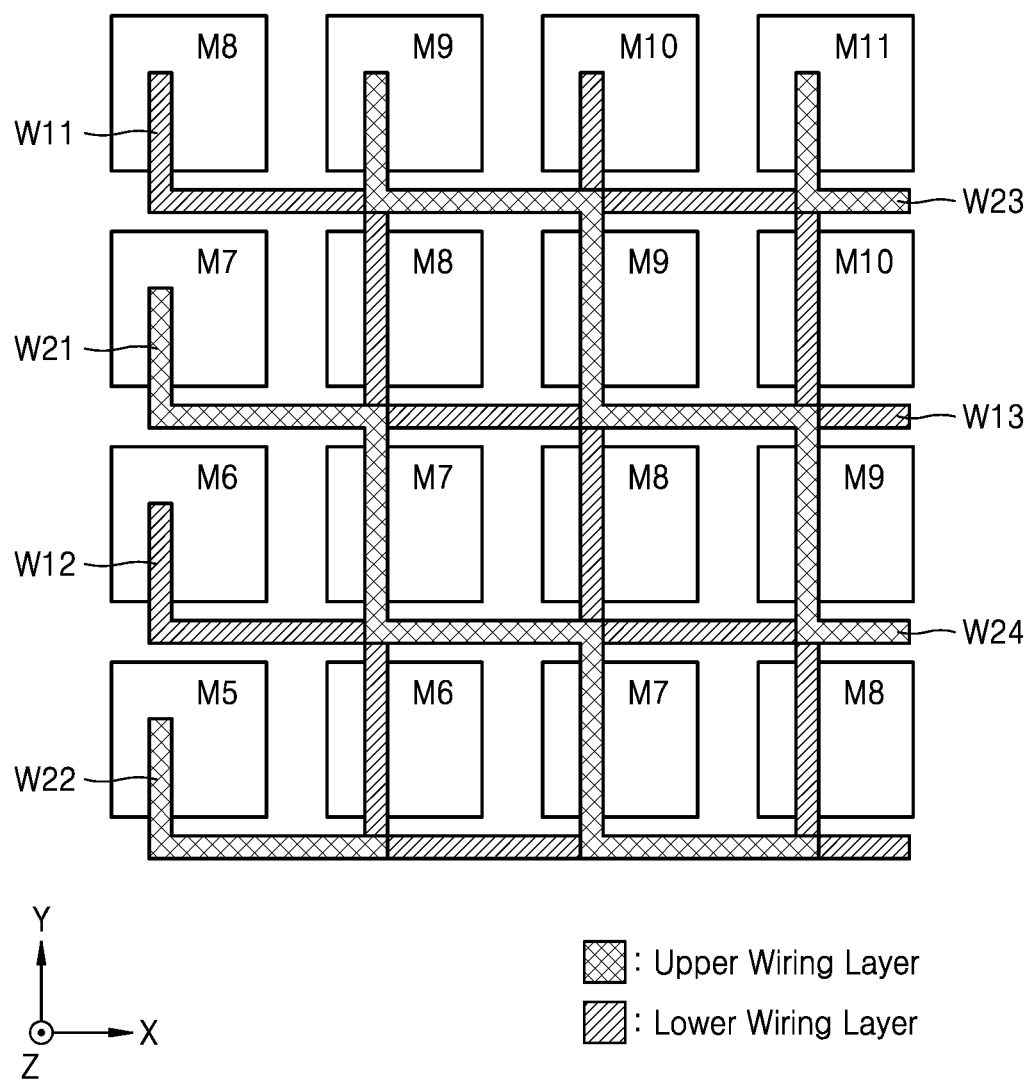
FIG. 5 is a plan view showing a layout of a DAC according to an example embodiment.

FIG. 5 is a plan view showing a layout of a DAC according to an example embodiment. More specifically, the plane view of FIG. 5 shows the region R3 of the current cell array 30a of FIG. 3A. In FIG. 5, a plane formed by the X axis and the Y axis may be referred to as a horizontal plane, components arranged in a +Z direction relative to other components may be referred to as being located over the other components, and components arranged in a −Z direction relative to other components may be referred to as being located under the other components. In FIG. 5, some layers may be shown for convenience of illustration, and a pattern including a conductive material, such as a pattern of a wiring layer, may be referred to as a conductive pattern or simply as a pattern. Hereinbelow, FIG. 5 will be described with reference to FIG. 2.

Referring to FIG. 5, a pattern for connecting current cells may be formed over current cells. As described above with reference to the drawings, current cells included in one current source may be interconnected to generate a current of the current source. For example, as shown in FIG. 5, a first pattern W11 of a lower wiring layer may connect MSB current cells indicated by 'M8', a second pattern W12 of the lower wiring layer may connect MSB current cells indicated by 'M6', and a third pattern W13 of the lower wiring layer may connect MSB current cells indicated by 'M10'. In addition, as shown in FIG. 5, a first pattern W21 of an upper wiring layer may connect MSB current cells indicated by 'M7', a second pattern W22 of the upper wiring layer may connect MSB current cells indicated by 'M5', a third pattern W23 of the upper wiring layer may connect MSB current cells indicated by 'M11', and a fourth pattern W24 of the upper wiring layer may connect MSB current cells indicated by 'M9'. The first to third patterns W11 to W13 of the lower wiring layer may be connected to the switch circuit 21, and the first to fourth patterns W21 to W24 of the upper wiring layer may be connected to the switch circuit 21. It is to be noted that a shape of a pattern for interconnecting current cells may be various, and example embodiments may not be limited by the patterns shown in FIG. 5.

Figure 6A:
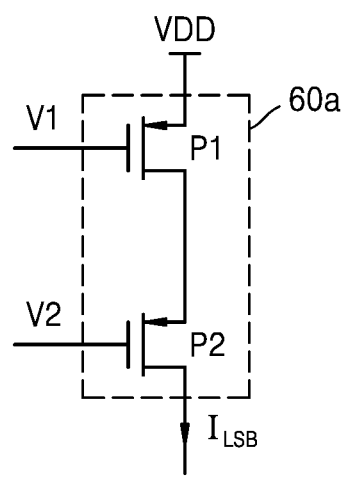
FIGS. 6A and 6B are circuit diagrams showing examples of current cells according to example embodiments.
Figure 6B:
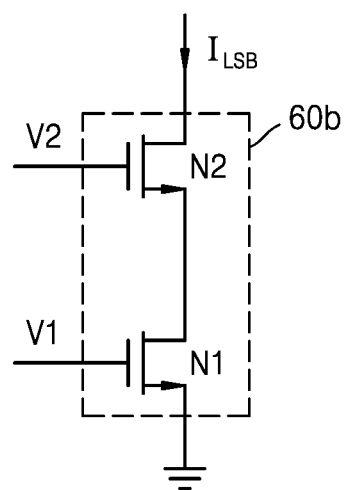

FIGS. 6A and 6B are circuit diagrams showing examples of current cells according to example embodiments. More specifically, a circuit diagram of FIG. 6A shows a current cell 60a that outputs an LSB current $I_{LSB}$, and a circuit diagram of FIG. 6B shows a current cell 60b that drains the LSB current $I_{LSB}$. In some embodiments, a current cell may have a casecode structure as shown in FIGS. 6A and 6B, but it is to be noted that example embodiments are not limited thereto.

Referring to FIG. 6A, the current cell 60a may include a first p-channel field-effect transistor (PFET) P1 and a second PFET P2. A gate of the first PFET P1 may receive a first voltage V1, and a gate of the second PFET P2 may receive a second voltage V2. The first voltage V1 and the second voltage V2 may be included in the bias signal BS of FIG. 1, and the bias generator 12 of FIG. 1 may generate the first voltage V1 and the second voltage V2. The first PFET P1 and the second PFET P2 may generate the LSB current $I_{LSB}$ from a node to which a positive supply voltage VDD is applied and output the LSB current $I_{LSB}$ to the outside of the current cell 60a, based on the first voltage V1 and the second voltage V2. In some embodiments, the first voltage V1 and the second voltage V2 may be equal to each other, and the gates of the first PFET P1 and the second PFET P2 may be interconnected.

Referring to FIG. 6B, the current cell 60b may include a first n-channel FET (NFET) N1 and a second NFET N2. A gate of the first NFET N1 may receive the first voltage V1, and a gate of the second NFET n2 may receive the second voltage V2. The first voltage V1 and the second voltage V2 may be included in the bias signal BS of FIG. 1, and the bias generator 12 of FIG. 1 may generate the first voltage V1 and the second voltage V2. The first NFET N1 and the second NFET N2 may generate the LSB current $I_{LSB}$ to be drained to a node to which a ground potential (or a negative supply voltage) is applied, and drain the LSB current $I_{LSB}$ from the outside of the current cell 60b, based on the first voltage V1 and the second voltage V2. In some embodiments, the first voltage V1 and the second voltage V2 may be equal to each other, and the gates of the first NFET N1 and the second NFET N2 may be interconnected.

Figure 7:
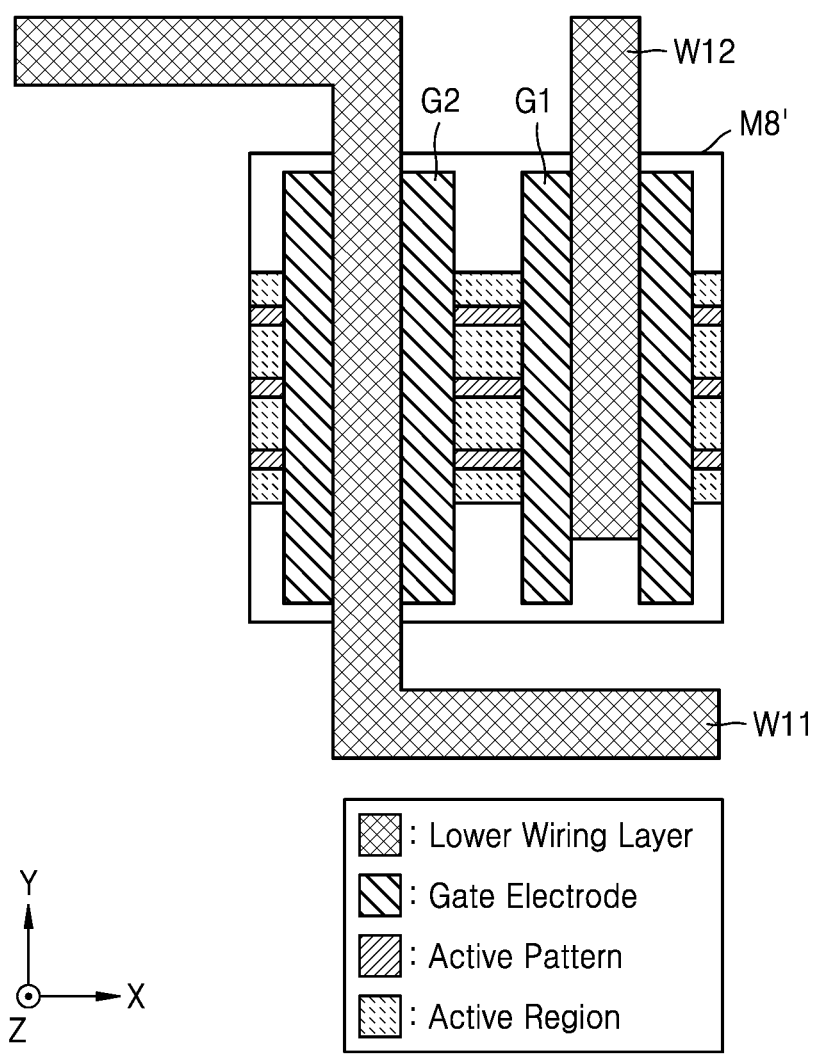
FIG. 7 is a plan view showing a layout of a DAC according to an example embodiment.

FIG. 7 is a plan view showing a layout of a DAC according to an example embodiment. More specifically, the plan view of FIG. 7 may show one MSB current cell M8' included in a current cell array and some patterns arranged over the MSB current cell M8'. In FIG. 7, a plane formed by the X axis and the Y axis may be referred to as a horizontal plane, components arranged in a +Z direction relative to other components may be referred to as being located over the other components, and components arranged in a −Z direction relative to other components may be referred to as being located under the other components. In FIG. 7, some layers may be shown for convenience of illustration.

Referring to FIG. 7, an active region may extend in parallel to the X axis in the MSB current cell M8'. The active region may be referred to as a device region, and a transistor may be formed in the active region. For example, when the MSB current cell M8' corresponds to the current cell 60a of FIG. 6A, a PFET may be formed in the active region, whereas when the MSB current cell M8' corresponds to the current cell 60b of FIG. 6B, an NFET may be formed in the active region.

In the active region, at least one active pattern may extend parallel to the X axis. For example, as shown in FIG. 7, three active patterns may extend parallel to the X axis in the active region. The active patterns may form transistors by intersecting gate electrodes extending parallel to the Y axis. For example, as shown in FIG. 7, first gate electrodes G1 and second gate electrodes G2 may extend parallel to the Y axis, and the active patterns may form transistors with the first gate electrodes G1 and the second gate electrodes G2, respectively.

A current cell may include a transistor of a certain structure. In some embodiments, an active pattern of a fin type may extend parallel to the X axis and an active pattern and a gate electrode may form a fin FET (FinFET). In some embodiments, the active pattern may include a plurality of nanowires that are separated in a Y-axis direction and/or a Z-axis direction and extend parallel to the X axis, and form a gate all around FET (GAAFET) with the gate electrode. In some embodiments, the active pattern may include a plurality of nanosheets that are separated in the Y-axis direction and/or the Z-axis direction and extend parallel to the X axis, and form a multi-bridge channel FET (MCBCFET) with the gate electrode. In some embodiments, a current cell may include a ForkFET where an N-type transistor and a P-type transistor are close to each other as nanosheets for the P-type transistor and nanosheets for the N-type transistor are separated by a dielectric wall. In some embodiments, the current cell may include a vertical FET (VFET) having a structure in which source/drain regions are separated from each other in the Z-axis direction with a channel region therebetween, which is surrounded by a gate electrode. The current cell may also include transistors of a structure that is different from the foregoing description, e.g., an FET such as a complementary FET (CFET), a negative capacitance FECT (NCFET), a carbon nanotube (CNT) FET, etc., a bipolar junction transistor, or other three-dimensional transistors.

When the MSB current cell M8' corresponds to a current cell 60a of FIG. 6A, the first gate electrode G1 may correspond to the gate of the first PFET P1 and the second gate electrode G2 may correspond to the gate of the second PFET P2. The first pattern W11 may be connected to a drain of the second PFET P2, and may be connected to a drain of the second PFET P2 included in another MSB current cell included in the same current source as that of the MSB current cell M8', i.e., an MSB current cell arranged in a diagonal direction with respect to the MSB current cell M8'. The second pattern W12 may be connected to a source of the first PFET P1, and a positive supply voltage VDD may be applied to the second pattern W12.

When the MSB current cell M8' corresponds to the current cell 60b of FIG. 6B, the first gate electrode G1 may correspond to the gate of the first NFET N1 and the second gate electrode G2 may correspond to the gate of the second NFET N2. The first pattern W11 may be connected to a drain of the second NFET N2, and may be connected to a drain of the second NFET N2 included in another MSB current cell included in the same current source as that of the MSB current cell M8', i.e., an MSB current cell arranged in the diagonal direction with respect to the MSB current cell M8'. The second pattern W12 may be connected to a source of the first NFET N1, and a ground potential (or a negative supply voltage) may be applied to the second pattern W12.

Figure 8:
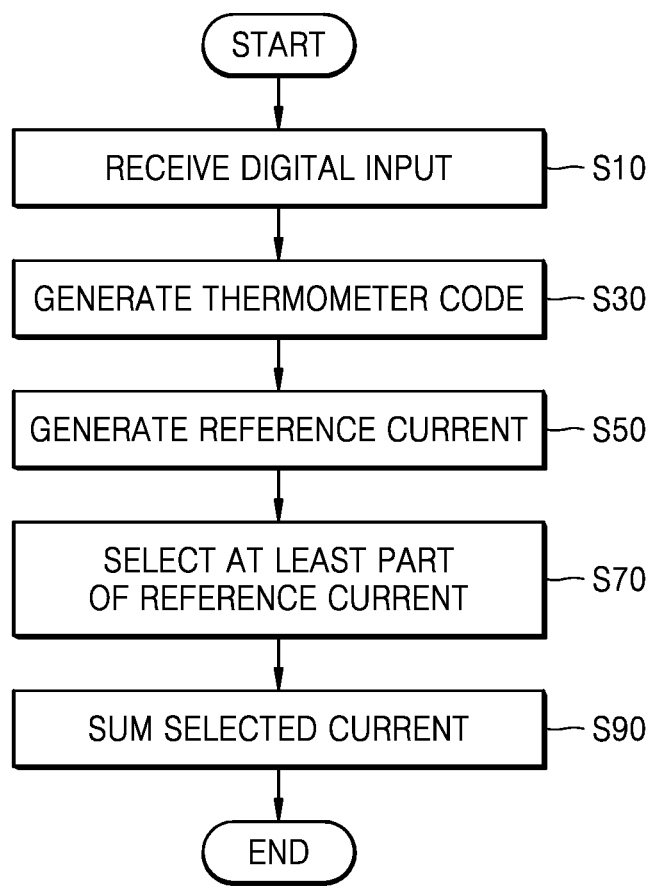
FIG. 8 is a flowchart showing a method of converting a digital input into an analog output according to an example embodiment.

FIG. 8 is a flowchart showing a method of converting a digital input into an analog output according to an exemplary embodiment. As shown in FIG. 8, the method of converting a digital input into an analog output may include a plurality of operations S10, S30, S50, S70, and S90. In some embodiments, the method of FIG. 8 may be performed by the DAC 10 of FIG. 1, and may be referred to as an operating method of the DAC 10. Hereinbelow, FIG. 8 will be described with reference to FIG. 1.

Referring to FIG. 8, in operation S10, a digital input may be received. For example, the DAC 10 may receive an input IN of N bits. The DAC 10 may generate an output OUT having one of $2^N$ different magnitudes based on a value of the input IN.

In operation S30, a thermometer code TMP may be generated. For example, the decoder 13 may generate the thermometer code TMP by decoding an upper bit group IN[N:M+1] of the input IN. The upper bit group IN[N:M+1] of the input IN may have (N−M) bits, and thus the decoder 13 may generate the thermometer code TMP of $2^{N-M}-1$ bits. The thermometer code TMP may include 1 of a number that is proportional to a value of the upper bit group IN[N:M+1] of the input IN.

In operation S50, a reference current $I_{REF}$ may be generated. For example, the current cell array 22 may include $2^N$ current cells each designed to generate the same current, i.e., the LSB current $I_{LSB}$, and the reference current $I_{REF}$ may include currents generated by the $2^N$ current cells. As the number of bits of the input IN, i.e., N increases, the number of current cells included in the current cell array 11 may increase and the area of the current cell array 11 may increase, such that a local variation may occur in the current cells included in the current cell array 11. As described above with reference to the drawings, in the current cell array 11, the current cells may be grouped to be commonly affected by the local variation, such that the linearity of the DAC 10 may be maintained in spite of the local variation.

In operation S70, at least a part of the reference current $I_{REF}$ may be selected. For example, the switch circuit 15 may receive the reference current $I_{REF}$ from the current cell array 11 through a plurality of conducting wires. The delay circuit 14 may delay a lower bit group IN[M:1] of the input IN, and the switch circuit 15 may receive the delayed lower bit group IN'[M:1] from the delay circuit 14. The switch circuit 15 may include switches respectively corresponding to bits of the thermometer code TMP and the delayed lower bit group IN'[M:1], and output a selected current $I_{SEL}$ as at least a part of the reference current $I_{REF}$ according to the thermometer code TMP and the delayed lower bit group IN'[M:1]. As described above with reference to the drawings, in the current cell array 11, a plurality of current cells may be grouped to be commonly affected by a local variation. Thus, in spite of the local variation occurring in the current cell array 11, the selected current $I_{SEL}$ may commonly increase or decrease in various values of the input IN. An example of operation S70 will be described with reference to FIG. 9.

In operation S90, the selected current $I_{SEL}$ may be summed. For example, the summation circuit 16 may receive the selected current $I_{SEL}$ from the switch circuit 15 through the plurality of conducting wires. The summation circuit 16 may sum currents respectively received through the plurality of conducting wires, and generate the output OUT having a magnitude corresponding to the summed current. In some embodiments, as will be described later with reference to FIG. 2, the summation circuit 16 may generate the output OUT by converting the summed current into a voltage.

Figure 9:
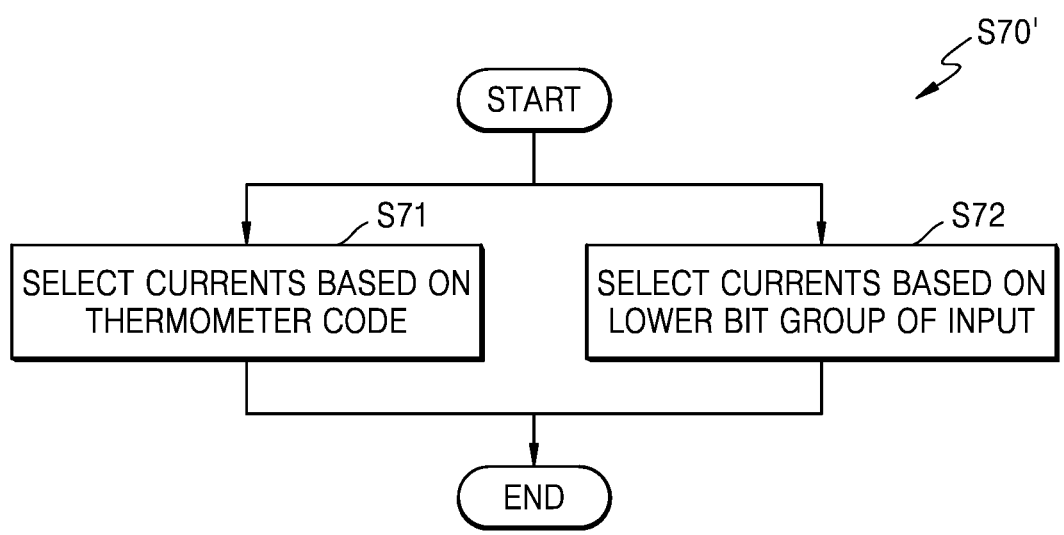
FIG. 9 is a flowchart showing a method of converting a digital input to an analog output according to an example embodiment.

FIG. 9 is a flowchart showing a method of converting a digital input to an analog output according to an exemplary embodiment. More specifically, the flowchart of FIG. 9 may indicate an example of operation S70. As described above with reference to FIG. 8, in operation S70' of FIG. 9, at least a part of the reference current $I_{REF}$ may be selected. As shown in FIG. 9, operation S70' may include operation S71 and operation S72. In some embodiments, operation S70' may be performed by the DAC 20 of FIG. 2, and hereinbelow, FIG. 9 will be described with reference to FIG. 2.

Referring to FIG. 9, in operation S71, currents may be selected based on the thermometer code TMP. For example, the decoder 22 may generate a thermometer code TMP of 15 bits from an upper bit group IN[8:5] of the input IN. The switch circuit 21 may include 15 switches respectively turned on or off according to bits of the thermometer code TMP, and the 15 switches may select a part of currents respectively provided from the fifth to nineteenth current sources CS5 to CS19.

In operation S72, currents may be selected based on a lower bit group of the input IN. For example, the delay circuit 23 may delay a lower bit group IN[4:1] of the input IN and output the delayed lower bit group IN'[4:1]. The switch circuit 21 may include 4 switches respectively turned on or off according to bits of the delayed lower bit group IN'[4:1], and the 4 switches may select a part of currents respectively provided from the first to fourth current sources CS1 to CS4. In general currents are selected based on both S71 and S72 before summing at S90, also see the common current line in FIG. 2 input to the junction of the resistor R and the "−" terminal of amplifier A.

Figure 10:
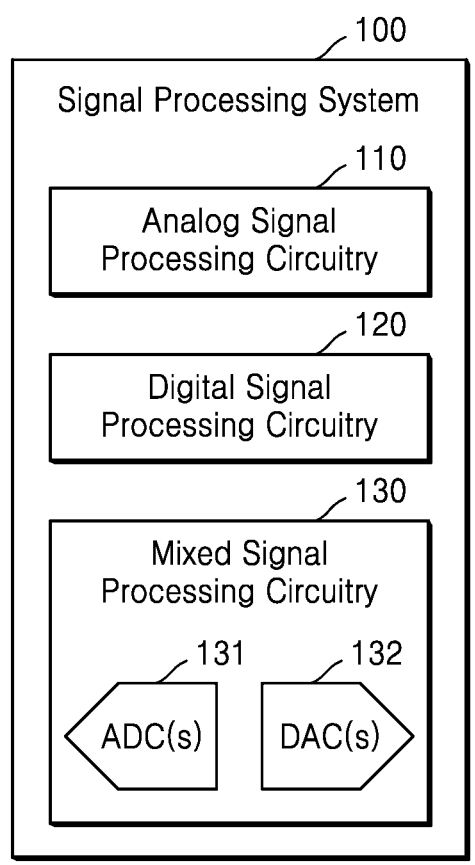
FIG. 10 is a block diagram showing a signal processing system according to an example embodiment.

FIG. 10 is a block diagram showing a signal processing system 100 according to an example embodiment. The DAC described above with reference to the drawings may be included in the signal processing system 100.

The signal processing system 100 may refer to a system that operates by processing a certain signal. In some embodiments, the signal processing system 100 may be a stationary computing system such as a desktop personal computer (PC), a server, etc., and a mobile computing system such as a laptop PC, a mobile phone, a wearable device, etc. The signal processing system 100 may be a single chip manufactured by a semiconductor process such as a system-on-chip (SoC), or may be a module in which two or more chips are mounted on a printed circuit board (PCB). As shown in FIG. 10, the signal processing system 100 may include analog signal processing circuitry 110, digital signal processing circuitry 120, and mixed signal processing circuitry 130. In some embodiments, the analog signal processing circuitry 110 and/or the digital signal processing circuitry 120 may be omitted.

The analog signal processing circuitry 110 may process an analog signal. For example, the analog signal processing circuitry 110 may include components for processing an analog signal, such as an amplifier, a filter, a mixer, etc. The analog signal processing circuitry 110 may also include passive devices such as a resistor, a capacitor, an inductor, etc.

The digital signal processing circuitry 120 may process a digital signal. For example, the digital signal processing circuitry 120 may include a component that stores data, such as memory, a register, etc. The digital signal processing circuitry 120 may include a programmable component such as a central processing unit (CPU), a digital signal processor (DSP), etc., a reconfigurable component such as a field programmable gate array (FPGA), and/or a component that provides a fixed function such as an intellectual property (IP) core.

The mixed signal processing circuitry 130 may include at least one ADC 131 and/or at least one DAC 132. The at least one ADC 131 may convert an analog signal provided from the analog signal processing circuitry 110 into a digital signal and provide the digital signal to the digital signal processing circuitry 120. The at least one DAC 132 may convert a digital signal provided from the digital signal processing circuitry 120 into an analog signal and provide the analog signal to the analog signal processing circuitry 110. The at least one DAC 132 may maintain linearity in spite of occurrence of a local variation as described with reference to the drawings, such that the performance and efficiency of the signal processing system 100 may be enhanced.

Various changes in form and details may be made therein without departing from the spirit and scope of the following claims.

What is claimed is:

1. A digital-to-analog converter comprising:
a current cell array comprising a plurality of current cells, each current cell of the plurality of current cells being configured to generate a current of a same magnitude;
a first pattern connecting first current cells, among the plurality of current cells, arranged along a diagonal line of the current cell array;
a second pattern connecting second current cells, among the plurality of current cells, arranged along a first oblique line parallel to the diagonal line; and
a third pattern connecting third current cells, among the plurality of current cells, arranged along a second oblique line parallel to the diagonal line, the third pattern being electrically connected to the second pattern,
wherein the diagonal line is between the first oblique line and the second oblique line and
wherein the second current cells and the third current cells are arranged with no second current cell and third current cell in a same row and with no second current cell and third current cell in a same column.

2. The digital-to-analog converter of claim 1, wherein the plurality of current cells are arranged in K rows and K columns in the current cell array, K being an integer greater than 1, and
a sum of a first number of the second current cells and a second number of the third current cells is equal to K.

3. The digital-to-analog converter of claim 1, wherein a digital input of the digital-to-analog converter is N bits, N being an integer greater than 1, and
currents generated by the first current cells are used for generation of an analog output of the digital-to-analog converter when a value of the digital input is equal to or greater than $2^{N-1}$.

4. The digital-to-analog converter of claim 1, further comprising a decoder configured to generate a thermometer code from an upper bit group comprising a most significant bit (MSB) of a digital input of the digital-to-analog converter,
wherein the first current cells correspond to a first bit of the thermometer code, and the second current cells and the third current cells commonly correspond to a second bit of the thermometer code.

5. The digital-to-analog converter of claim 4, wherein the plurality of current cells comprises fourth current cells and fifth current cells corresponding to a lower bit group comprising a least significant bit of the digital input,
the fourth current cells are arranged along a third oblique line parallel to the diagonal line,
the fifth current cells are arranged along a fourth oblique line parallel to the diagonal line, and
the diagonal line is between the third oblique line and the fourth oblique line.

6. The digital-to-analog converter of claim 5, wherein the fourth current cells and the fifth current cells are arranged with no fourth current cell and fifth current cell in a same row and with no fourth current cell and fifth current cell in a same column.

7. The digital-to-analog converter of claim 5, wherein the third oblique line and the fourth oblique line respectively correspond to a first diagonal line of a first quadrant of the current cell array and a second diagonal line of a second quadrant of the current cell array.

8. The digital-to-analog converter of claim 1, wherein each current cell of the plurality of current cells comprises a first transistor and a second transistor that are connected in series and are respectively biased by a first voltage and a second voltage.

9. The digital-to-analog converter of claim 1, wherein the first pattern is configured to connect every current cell of the first current cells arranged along the diagonal line and no other current cells, and
wherein the diagonal line is a main diagonal of the current cell array.

10. A digital-to-analog converter comprising:
a decoder configured to generate a thermometer code from an upper bit group comprising a most significant bit (MSB) of a digital input of the digital-to-analog converter;
a current cell array comprising a plurality of current cells, each current cell of the plurality of current cells being configured to generate a current of a same magnitude; and
a switch circuit configured to select at least a part of currents generated by the current cell array,
wherein the plurality of current cells comprises:
first current cells arranged along a diagonal line of the current cell array and corresponding to a first bit of the thermometer code;
second current cells arranged along a first oblique line parallel to the diagonal line and corresponding to a second bit of the thermometer code; and
third current cells arranged along a second oblique line parallel to the diagonal line and corresponding to the second bit of the thermometer code, and
wherein the diagonal line is between the first oblique line and the second oblique line.

11. The digital-to-analog converter of claim 10, wherein the second current cells and the third current cells are arranged with no second current cell and third current cell in a same row and with no second current cell and third current cell in a same column.

12. The digital-to-analog converter of claim 10, wherein the digital input is N bits, N being an integer greater than 1, and
currents generated by the first current cells are selected by the switch circuit when a value of the digital input is equal to or greater than $2^{N-1}$.

13. The digital-to-analog converter of claim 10, wherein the plurality of current cells comprises fourth current cells and fifth current cells corresponding to a lower bit group comprising a least significant bit of the digital input,
the fourth current cells are arranged along a third oblique line parallel to the diagonal line,
the fifth current cells are arranged along a fourth oblique line parallel to the diagonal line, and
the diagonal line is between the third oblique line and the fourth oblique line.

14. The digital-to-analog converter of claim 13, wherein the fourth current cells and the fifth current cells are arranged with no fourth current cell and fifth current cell in a same row and with no fourth current cell and fifth current cell in a same column.

15. The digital-to-analog converter of claim 13, wherein the third oblique line and the fourth oblique line respectively correspond to a first diagonal of a first quadrant and a second diagonal of a second quadrant of the current cell array.

16. A method of converting a digital input into an analog output, the method comprising:
generating a thermometer code from an upper bit group comprising a most significant bit (MSB) of the digital input;
generating a reference current by a current cell array comprising a plurality of current cells, wherein each current cell of the plurality of current cells is configured to generate a current of a same magnitude;
selecting at least a part of the reference current, based on the thermometer code and a lower bit group comprising a least significant bit of the digital input; and
generating the analog output by summing a selected current,
wherein the selecting the at least the part of the reference current comprises selecting currents generated by first current cells, among the plurality of current cells, arranged with no two first current cells in a same row and with no two first current cells in a same column, based on one bit of the thermometer code.

17. The method of claim 16, wherein the first current cells are arranged along a diagonal line of the current cell array or along a first oblique line and a second oblique line that are parallel to the diagonal line.

18. The method of claim 17, wherein the digital input is of N bits, N being an integer greater than 1, and
the selecting the at least the part of the reference current comprises selecting currents generated by the first current cells arranged along the diagonal line when a value of the digital input is equal to or greater than $2^{N-1}$.

19. The method of claim 16, wherein the selecting the at least the part of the reference current comprises selecting at least a part of currents generated by second current cells, among the plurality of current cells, arranged along a third oblique line parallel to a diagonal line of the current cell array and third current cells, among the plurality of current cells, arranged along a fourth oblique line parallel to the diagonal line, based on the lower bit group, and
the diagonal line is between the third oblique line and the fourth oblique line.

20. The method of claim 19, wherein the third oblique line and the fourth oblique line respectively correspond to diagonal lines of quadrants of the current cell array.

* * * * *